(12) United States Patent
Matsubara et al.

(10) Patent No.: US 8,568,621 B2
(45) Date of Patent: Oct. 29, 2013

(54) TRANSPARENT CONDUCTIVE FILM

(75) Inventors: Masahito Matsubara, Chiba (JP); Masashi Ohyama, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 124 days.

(21) Appl. No.: 13/381,403

(22) PCT Filed: Jun. 23, 2010

(86) PCT No.: PCT/JP2010/004174
§ 371 (c)(1),
(2), (4) Date: Jan. 31, 2012

(87) PCT Pub. No.: WO2011/001631
PCT Pub. Date: Jan. 6, 2011

(65) Prior Publication Data
US 2012/0112138 A1    May 10, 2012

(30) Foreign Application Priority Data

Jun. 30, 2009   (JP) .................................. 2009-155471

(51) Int. Cl.
*H01B 1/08* (2006.01)
*H01B 5/14* (2006.01)
*C23C 14/08* (2006.01)

(52) U.S. Cl.
USPC .................................. 252/519.5; 252/519.51

(58) Field of Classification Search
USPC .................... 252/519.5, 519.51; 428/922
See application file for complete search history.

(56) References Cited

U.S. PATENT DOCUMENTS

| 6,533,965 B1* | 3/2003 | Sasaki et al. ............... 252/519.5 |
| 6,689,477 B2* | 2/2004 | Inoue ............................. 428/432 |
| 7,889,298 B2 | 2/2011 | Umeno et al. |
| 7,972,952 B2 | 7/2011 | Fukunaga et al. |

FOREIGN PATENT DOCUMENTS

| JP | 58209809 | 12/1983 |
| JP | 2001 155549 | 6/2001 |
| JP | 2002 118960 | 4/2002 |
| JP | 2005 262951 | 9/2005 |
| JP | 2005 274741 | 10/2005 |
| JP | 2008 147459 | 6/2008 |
| WO | WO-2007 058066 | 5/2007 |

OTHER PUBLICATIONS

International Preliminary Report on Patentability for PCT/JP2010/004174 dated Feb. 14, 2012.
International Search Report for PCT/JP2010/004174 dated Aug. 31, 2010.
Shinshu Univ, "Transparent electrode substrate," Patent Abstracts of Japan, Publication Date: Oct. 6, 2005; English Abstract of JP-2005 274741.

(Continued)

*Primary Examiner* — Mark Kopec
(74) *Attorney, Agent, or Firm* — Millen, White, Zelano & Branigan, P.C.

(57) ABSTRACT

A transparent conductive film which is an indium zinc oxide film comprising $In_2O_3$ crystals, and has an X-ray diffraction peak using a Cu$K\alpha$ ray that appears within at least one area selected from areas ranging from $2\theta=35.5°$ to $37.0°$, $39.0°$ to $40.5°$ and $66.5°$ to $67.8°$, wherein the peak intensities of peaks that appear within areas ranging from $2\theta=30.2°$ to $30.8°$ and $54.0°$ to $57.0°$ are 20% or less of the peak intensity of the main peak.

3 Claims, 6 Drawing Sheets

(56) References Cited

OTHER PUBLICATIONS

Yaglioglu, B. et al., "A study of amorphous and crystalline phases in $In_2O_3$-10 wt. % ZnO thin films deposited by DC magnetron sputtering," Thin Solid Films, 2006, vol. 496, pp. 89-94.

ALPS Electric Co Ltd., "Oxide transparent conductive film, target for forming the same, method of manufacturing substrate having oxide transparent conductive film, electronic equipment and liquid crystal display unite." Patent Abstracts of Japan. Publication Date: Jun. 8, 2001: English Abstract of JP-2004 155549.

Mark Tec KK, "Electricity charge rate management apparatus and recording medium therefore," Patent Abstracts of Japan, Publication Date: Apr. 19, 2002; English Abstract of JP-2002 118960.

Nissan Motor Co Ltd., "Vehicle Front Body structure," Patent Abstracts of Japan, Publication Date; Sep. 29, 2005; English Abstract of JP-2005 262951.

Thomson Innovation Record View, Publication Date: Dec. 6, 1983; English Abstract of JP-58 209809.

* cited by examiner

TRANSPARENT CONDUCTIVE FILM

TECHNICAL FIELD

The invention relates to a transparent conductive film.

BACKGROUND ART

Transparent conductive films are widely used for a window electrode of a photoelectric transducer in a solar cell, an electromagnetic shielding film for electromagnetic shield, an electrode of an input device such as a transparent touch panel, a transparent electrode of a liquid crystal display, an electroluminescence (EL) luminous body and an electrochromic (EC) display, and the like.

For the purpose of increasing the conversion efficiency in the use of solar cells, and preventing visibility from deterioration in the use of display devices, good electrical conductivity as well as high transparency are required for the transparent conductive film.

For the transparent conductive films, indium tin oxide (ITO), indium zinc oxide, Al-doped zinc oxide (AZO), and the like are used.

To increase transparency of the transparent conductive film, a method of increasing transparency by means of the optical design is generally employed. However, the method suffers from the disadvantage that it is necessary to laminate films having different refractive indexes, which makes the process to be complicated (Patent document 1).

Meanwhile, although ITO is improved in the transmittance by applying heat treatment, the average transmittance within the visible light region is about 90%, which is not sufficient (Patent Document 2). In Patent Document 3 and Non-patent Document 1, indium zinc oxide is crystallized into the bixbyite structure by heat treatment under a nitrogen atmosphere to increase the transmittance. However, the increase of transmittance was not more than that to the degree of the heat-treated ITO.

RELATED ART DOCUMENTS

[Patent Documents]
[Patent Document 1] JP-A-2005-274741
[Patent Document 2] JP-A-S58-209809
[Patent Document 3] JP-A-2008-147459
[Non-patent Documents]
[Non-patent document 1] Thin Solid Films, 496 (2006), p.89-94

SUMMARY OF THE INVENTION

An object of the invention is to provide a transparent conductive film having good electrical conductivity and excellent transparency.

As mentioned-above, it has been known that indium zinc oxide can be crystallized into the bixbyite structure by annealing an electrode formed of indium zinc oxide under a nitrogen atmosphere, the transmittance can be increased although the increase is not enough, and driving voltage of an LED can be decreased. The inventers conducted extensive researches and found an indium zinc oxide film which has a specific structure as well as increased transmittance.

According to the invention, the following transparent conductive film is provided.

1. A transparent conductive film which is an indium zinc oxide film comprising $In_2O_3$ crystals, and has an X-ray diffraction peak using a Cuk$\alpha$ ray that appears within at least one area selected from areas ranging from $2\theta=35.5°$ to $37.0°$, $39.0°$ to $40.5°$ and $66.5°$ to $67.8°$, wherein the peak intensities of peaks that appear within areas ranging from $2\theta=30.2°$ to $30.8°$ and $54.0°$ to $57.0°$ are 20% or less of the peak intensity of the main peak.
2. The transparent conductive film according to 1, wherein the content of ZnO is 2 to 20 wt %.
3. The transparent conductive film according to 1 or 2, wherein the content of Sn is 1000 wt ppm or less.

The invention can provide a transparent conductive film having good electrical conductivity and excellent transparency.

MODE FOR CARRYING OUT THE INVENTION

Figure 1:
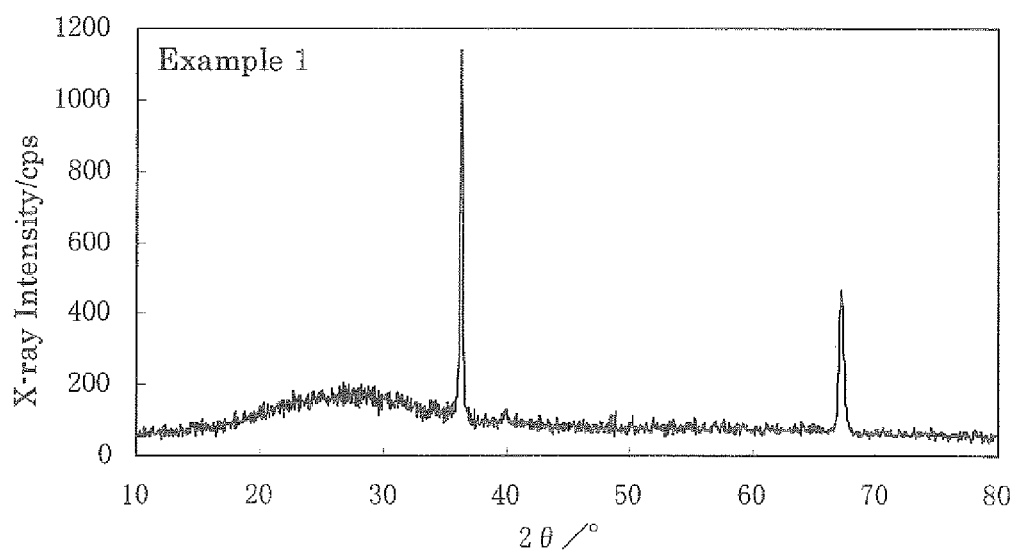
[FIG. 1] is an X-ray diffraction chart of the transparent conductive film obtained in Example 1.
Figure 2:
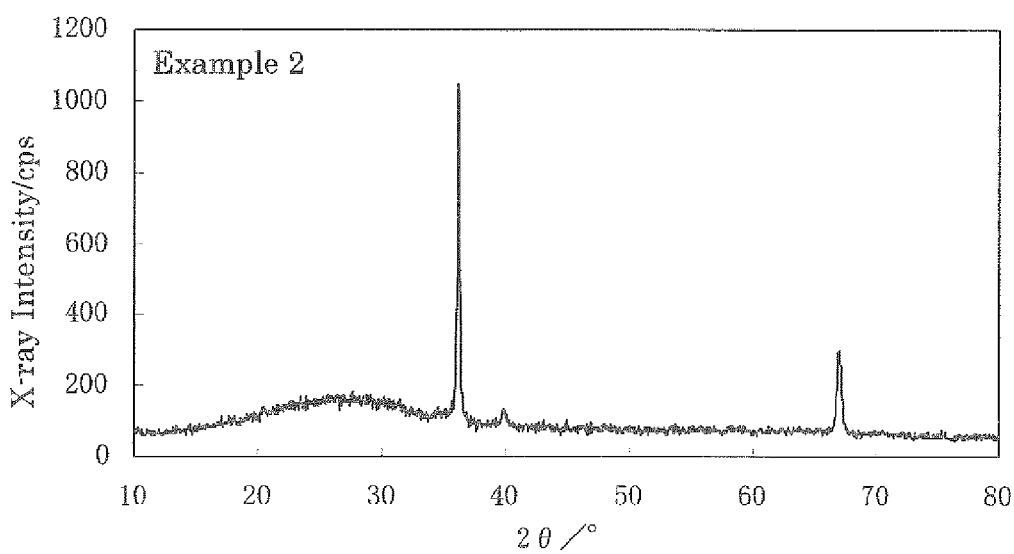
[FIG. 2] is an X-ray diffraction chart of the transparent conductive film obtained in Example 2.
Figure 3:
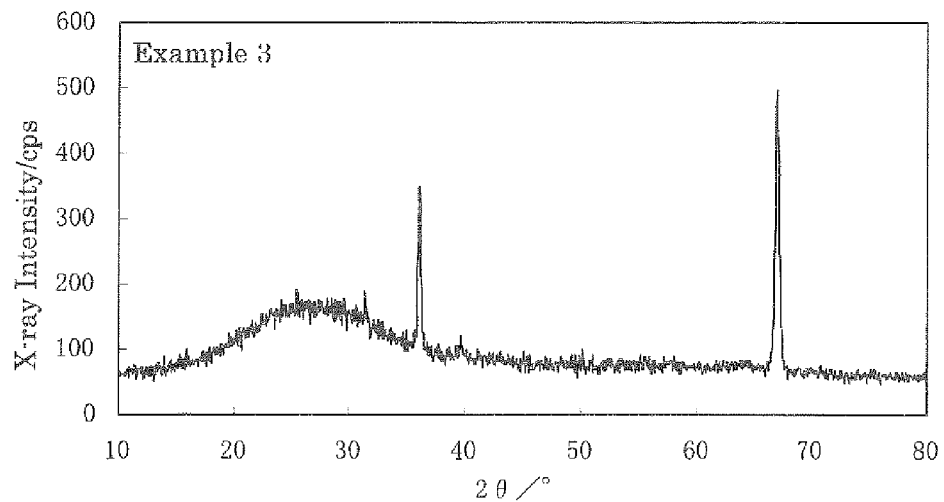
[FIG. 3] is an X-ray diffraction chart of the transparent conductive film obtained in Example 3.
Figure 4:
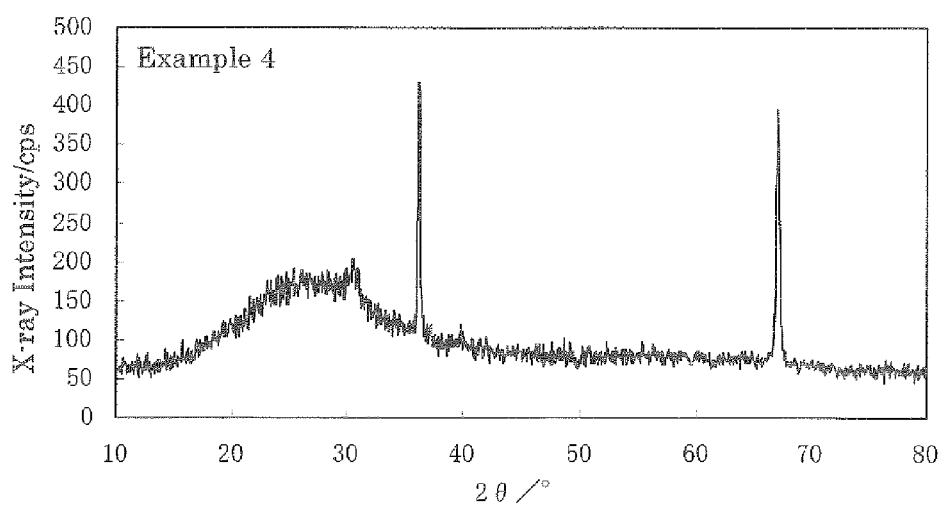
[FIG. 4] is an X-ray diffraction chart of the transparent conductive film obtained in Example 4.
Figure 5:
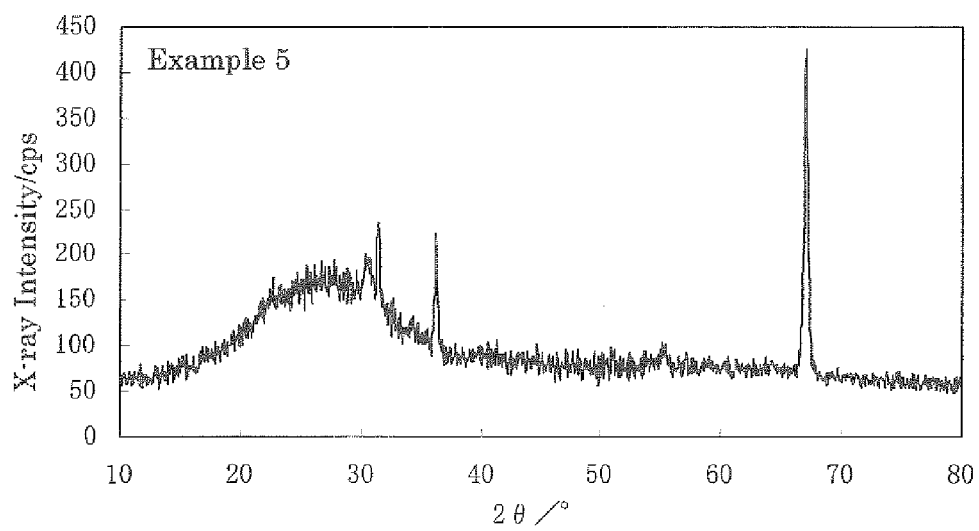
[FIG. 5] is an X-ray diffraction chart of the transparent conductive film obtained in Example 5.
Figure 6:
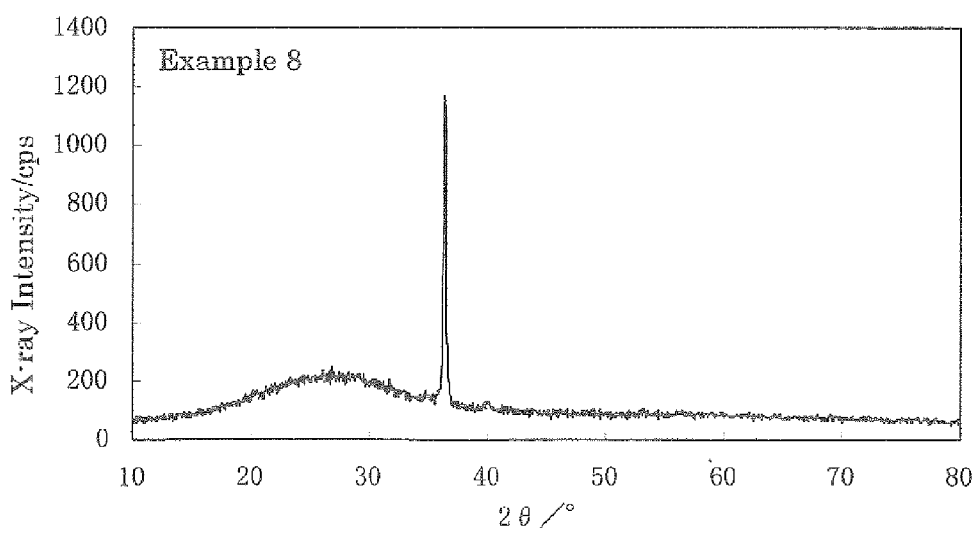
[FIG. 6] is an X-ray diffraction chart of the transparent conductive film obtained in Example 8.
Figure 7:
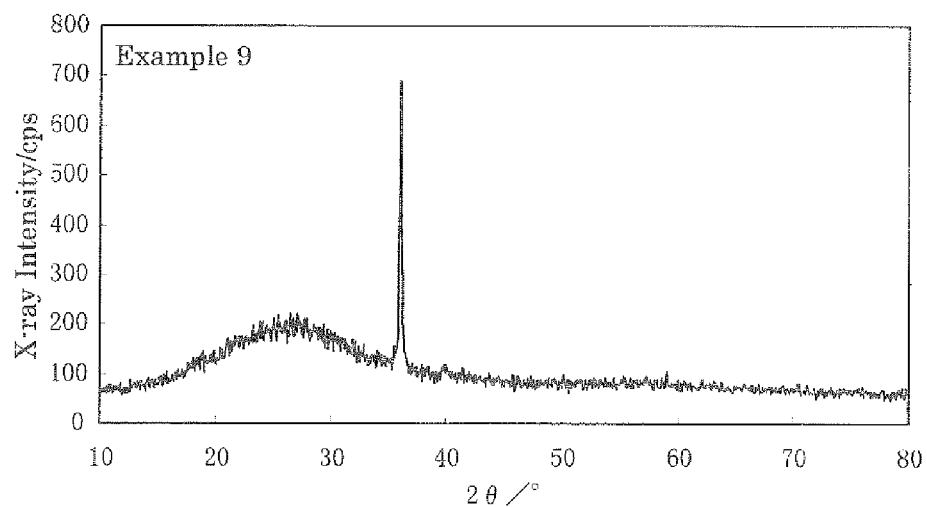
[FIG. 7] is an X-ray diffraction chart of the transparent conductive film obtained in Example 9.
Figure 8:
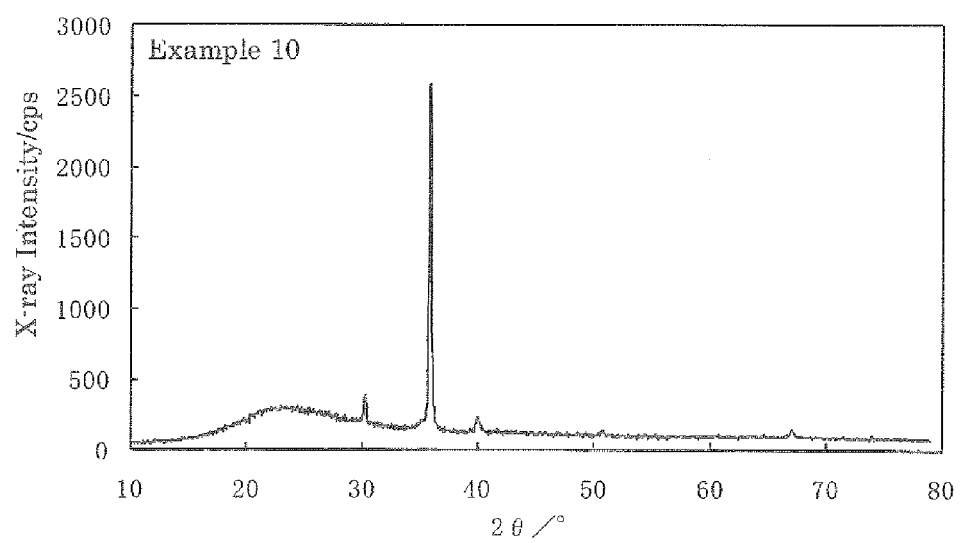
[FIG. 8] is an X-ray diffraction chart of the transparent conductive film obtained in Example 10.
Figure 9:
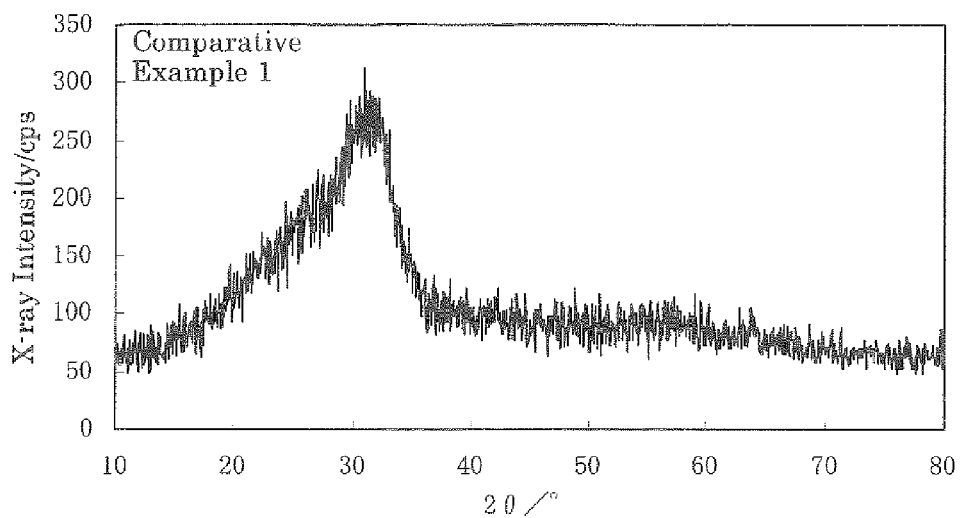
[FIG. 9] is an X-ray diffraction chart of the transparent conductive film obtained in Comparative Example 1.
Figure 10:
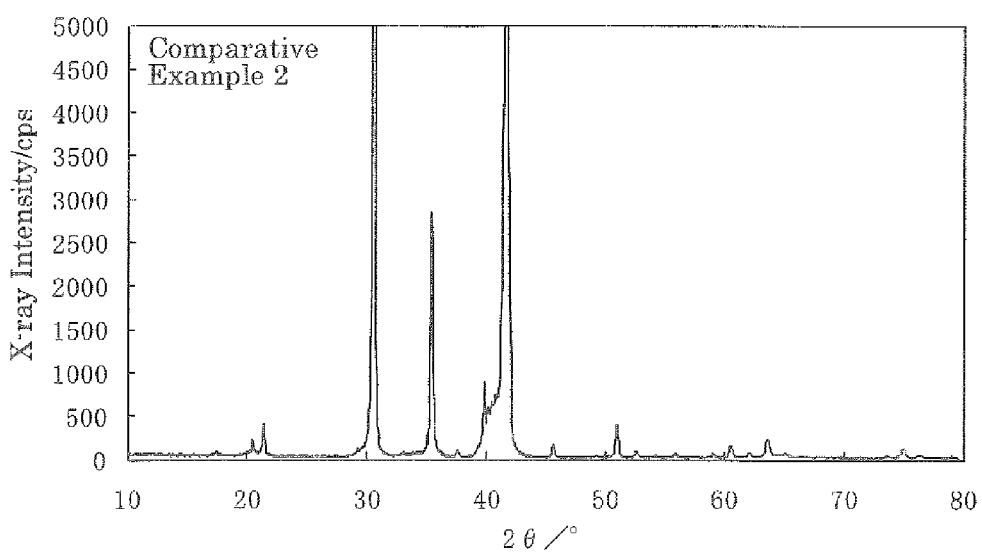
[FIG. 10] is an X-ray diffraction chart of the transparent conductive film obtained in Comparative Example 2.
Figure 11:
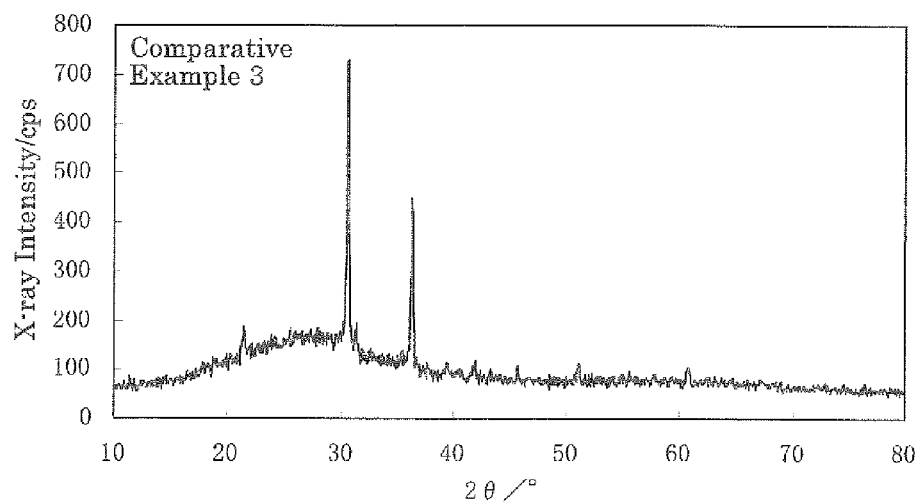
[FIG. 11] is an X-ray diffraction chart of the transparent conductive film obtained in Comparative Example 3.
Figure 12:
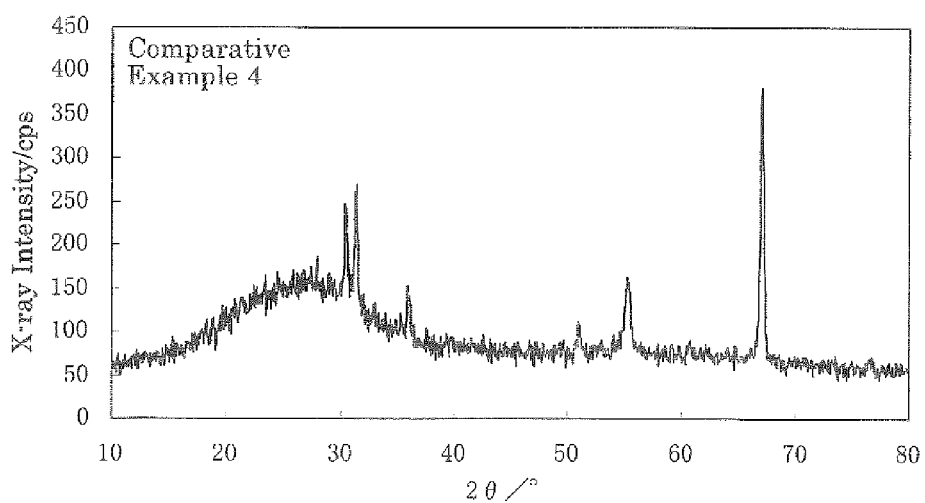
[FIG. 12] is an X-ray diffraction chart of the transparent conductive film obtained in Comparative Example 4.

The transparent conductive film of the invention which is an indium zinc oxide film comprising $In_2O_3$ crystals, has an X-ray diffraction peak using a Cuk$\alpha$ ray that appears within at least one area selected from areas ranging from $2\theta=35.5°$ to $37.0°$, $39.0°$ to $40.5°$ and $66.5°$ to $67.8°$, wherein the peak intensities of peaks that appear within areas ranging from $2\theta=30.2°$ to $30.8°$ and $54.0°$ to $57.0°$ are 20% or less of the peak intensity of the main peak.

In the invention, the main peak means the highest peak of peaks obtained by conducting the X-ray diffraction measurement using a Cuk$\alpha$ ray. Also, the peak intensity being 20% or less of the peak intensity of the main peak means that the peak height of X-ray diffraction peak measured using a Cuk$\alpha$ ray is 20% or less of the peak height of the main peak.

The transparent conductive film of the invention has high transparency and low resistance due to that the crystal structure has an X-ray diffraction peak (Cuk$\alpha$:$\lambda$=1.5418 Å) that appears within at least one area selected from areas ranging from $2\theta=35.5°$ to $37.0°$, $39.0°$ to $40.5°$ and $66.5°$ to $67.8°$.

The X-ray diffraction peak that appears within the area ranging from $2\theta=35.5°$ to $37.0°$, is present within the area ranging from preferably $2\theta=35.8°$ to $36.6°$, and more preferably $2\theta=36.0°$ to $36.4°$.

The X-ray diffraction peak that appears within the area ranging from 2θ=39.0° to 40.5°, is present within the area ranging from preferably 2θ=39.4° to 40.3°, and more preferably 2θ=39.6° to 40.1°.

The X-ray diffraction peak that appears within the area ranging from 2θ=66.5° to 67.8°, is present within the area ranging from preferably 2θ=66.7° to 67.5°, and more preferably 2θ=66.9° to 67.3°.

The transparent conductive film of the invention has the peak intensities of X-ray diffraction peaks (Cukα: λ=1.5418 Å) that appear within areas ranging from 2θ=30.2° to 30.8° and 54.0° to 57.0°, which are 20% or less of the peak intensity of the main peak.

Here, the peak intensity being 20% or less of the peak intensity of the main peak includes no peak that appears within the areas ranging from 2θ=30.2° to 30.8° and 54.0° to 57.0°.

The X-ray diffraction peak that appears within the area ranging from 2θ=54.0° to 57.0°, is present within the area ranging from preferably 2θ=54.5° to 55.7°, and more preferably 2θ=55.0° to 55.2°.

It has been known that a crystal of the bixbyite structure has X-ray diffraction peaks (Cukα: λ=1.5418 Å) that appear within areas ranging from 2θ=30.2° to 30.8°, 50.8° to 51.3° and 60.4° to 60.8°, and that the relative peak intensities thereof are approximately 100, 35, and 25, respectively.

When there is the crystal of the bixbyite structure in a transparent conductive film, decrease in the transmittance or increase in the resistance may occur. Namely, the transparent conductive film of the invention can attain high transparency and low resistance because of a small ratio of the bixbyite structure.

It is considered that the X-ray diffraction peak (Cukα: λ=1.5418 Å) that appears within the area ranging from 2θ=54.0° to 57.0° indicates an impurity. The impurity may cause increase in the resistance of a transparent conductive film. Namely, the transparent conductive film of the invention can attain low resistance because of a small ratio of the impurity.

In the transparent conductive film of the invention, the content of ZnO is preferably 2 to 20 wt %, and more preferably 5 to 15 wt %.

When the content of ZnO in the film is less than 2 wt %, crystals of the bixbyite structure may generate at the time of film formation. On the other hand, when the content of ZnO in the film is more than 20 wt %, the ratio of crystals of the bixbyite structure in the transparent conductive film may increase.

In the transparent conductive film of the invention, the content of Sn is preferably 1000 wt ppm or less, and more preferably 800 wt ppm or less.

When the content of Sn in the film exceeds 1000 wt ppm, the resistance of the film may increase.

The content of ZnO in the transparent conductive film of the invention can be measured by a well-known method. For instance, the measurement can be done using ICP (Inductively Coupled Radiofrequency Plasma Atomic Emission Spectrometer).

The content of Sn in the transparent conductive film of the invention can be measured by a well-known method. For instance, the measurement can be done using ICP-MS (Inductively Coupled Radiofrequency Plasma Mass Spectrometry).

The transparent conductive film of the invention may contain other components insofar as the transparency and conductivity do not deteriorate. For instance, the transparent conductive film of the invention may contain Ga and/or a positive tetravalent metal element.

However, the transparent conductive film of the invention may be substantially composed only of the above-mentioned indium oxide, zinc oxide and tin. The "substantially" means that 95 wt % or more and 100 wt % or less (preferably 98 wt % or more and 100 wt % or less) of the transparent conductive film is occupied by the above-mentioned components, or that the transparent conductive film may contain unavoidable impurities insofar as the effects of the invention do not deteriorate.

In view of attaining the low specific resistance and the high optical transmittance, the thickness of the transparent conductive film of the invention is preferably 35 nm to 1000 nm, and in view of the production cost, it is preferably 1000 nm or less.

The transparent conductive film of the invention is produced by forming an amorphous indium zinc oxide film on a substrate using a sintered body containing $In_2O_3$ and ZnO, and annealing the amorphous indium zinc oxide film. At this time, the peak intensity of the peak that appears within the area ranging from 30.2° to 30.8° can be made smaller or eliminated by adjusting together the concentration of ZnO, and the substrate temperature, the atmosphere and the temperature during annealing. In general, the annealing is conducted under an oxygen-free atmosphere at a temperature of 200 to 750° C. The film obtained by sputtering is crystallized by the annealing so that peaks appear within at least one area selected from areas ranging from 35.5° to 37.0°, 39.0° to 40.5° and 66.5° to 67.8°.

The transparent conductive film of the invention can be obtained by sputtering using a sintered body containing 3 to 20 wt % of ZnO in $In_2O_3$ at a substrate temperature of 100 to 500° C. to form an amorphous indium zinc oxide film on the substrate, and annealing the amorphous indium zinc oxide film under an oxygen-free atmosphere at a temperature of 200 to 700° C.

Suitable conditions for a sintered body containing $In_2O_3$ and ZnO, which is used for film formation are the same as the suitable conditions for the transparent conductive film of the invention. Namely, the content of ZnO in the sintered body containing $In_2O_3$ and ZnO is preferably 3 to 20 wt %, and more preferably 5 to 15 wt %. The content of Sn in the sintered body containing $In_2O_3$ and ZnO is preferably 1000 wt ppm or less, and more preferably 100 wt ppm or less.

Here, the composition of the amorphous indium zinc oxide film generally almost agrees with the composition of the sintered body used for film forming.

There is no particular limitation for the substrate and known substrates can be used. For instance, glass substrates such as an alkali silicate glass, an alkali-free glass and a quartz glass, silicon substrates, sapphire substrates, resin substrates such as acryl, polycarbonate and polyethylene naphthalate (PEN), and polymer film substrates such as polyethylene terephthalate (PET) and polyamide can be employed.

The thickness of the substrate is generally 0.1 to 10 mm, and preferably 0.3 to 5 mm. In the case of a glass substrate, chemically or thermally strengthened one is preferable. In the case where transparency or smoothness is needed, the glass substrates and the resin substrates are preferable, and the glass substrates are particularly preferable. In the case where light-weight is needed, the resin substrates and the polymer substrates are preferable.

Formation of the amorphous indium zinc oxide film can be carried out by the sputtering method, the deposition method, the ion beam method, or the like.

When an amorphous indium zinc oxide film is formed by the sputtering method, the substrate temperature is preferably 100° C. to 300° C., and more preferably 150° C. to 300° C.

As the film-forming condition for an amorphous indium zinc oxide, the oxygen partial pressure is preferably 0 to 5%, the pressure during film-formation is preferably 0.1 to 0.8 Pa, and the target-substrate distance is preferably 500 mm to 5000 mm. As the power source, DC or RF can be used.

The transparent conductive film of the invention is obtained by annealing the amorphous indium zinc oxide film under an oxygen-free atmosphere to crystallize the film.

The oxygen-free atmosphere is the atmosphere in which the oxygen partial pressure is 1% or less, preferably the oxygen partial pressure is 0.5% or less, and more preferably the oxygen partial pressure is 0.1% or less.

The oxygen-free atmosphere includes inert gas atmosphere and vacuum atmosphere.

As the inert gas in the inert gas atmosphere, gases such as nitrogen and argon can be used.

The vacuum atmosphere is the atmosphere that the pressure is 1 Pa or less, preferably 0.5 Pa or less, and more preferably 0.2 Pa or less.

The annealing temperature for the amorphous indium zinc oxide film is 200° C. to 750° C., preferably 400 to 700° C., and more preferably 500 to 700° C.

In particular, when the annealing temperature is 200° C. or higher and lower than 300° C., it is preferable that the content of ZnO contained in the sintered body used for film formation is 5 to 8 wt %.

When the annealing temperature is lower than 200° C., crystallization may not occur. On the other hand, when the annealing temperature exceeds 750° C., the ratio of the bixbyite crystal may increase.

The annealing duration is preferably 5 to 10 minutes in the case where the annealing temperature is 500 to 750° C. When the annealing temperature is 200° C. or higher and 400° C. or lower, it is preferably 60 minutes to 240 minutes.

The transparent conductive film of the invention, for example, has a transmittance of 80% or more with respect to light having a wavelength ranging from 350 nm to 450 nm when the film thickness is 50 to 300 nm, and can suitably be used for the transparent electrodes of liquid crystal displays, light-emitting diodes (LEDs), organic light-emitting diodes (OLEDs), solar cells, and the like.

Namely, the invention also includes a liquid crystal display, a light-emitting diode (LED), an organic light-emitting diode (OLED) and a transparent electrode which have the indium zinc oxide film of the invention.

EXAMPLES

Example 1

By using a magnetron-sputter coater, a target containing 10.7 wt % of ZnO in $In_2O_3$ (IZO; Registered trademark, manufactured by IDEMITSU KOSAN CO., LTD.) was sputtered at a substrate temperature of 200° C. to form an amorphous indium zinc oxide film having a thickness of 300 nm on a glass substrate. The glass substrate with the amorphous indium zinc oxide film was annealed in vacuo at a temperature of 500° C. for 10 minutes to obtain an indium zinc oxide film.

Here, the sputtering atmosphere was adjusted to 0.1 Pa with argon gas containing 3% of oxygen. Film forming was carried out with the distance between the glass substrate and the target of 100 mm.

For the indium zinc oxide film obtained, X-ray diffraction measurement was conducted. FIG. 1 and Table 1 show the results. Also, for the indium zinc oxide film obtained, the average transmittance and the specific resistance were evaluated. Table 1 shows the results.

Here, the average transmittance is a mean value of the transmittances of the indium zinc oxide film measured by 1 nm in wave length range of 350 to 450 nm.

The conditions for the X-ray diffraction measurement are as follows:
Apparatus: Miniflex II, manufactured by Rigaku
Radiation source: Cukα
Voltage: 30 kV
Current: 15 mA
Sampling interval: 0.05°
Scanning speed: 2°/min The conditions for the average transmittance measurement are as follows:
Apparatus: UV-3600, manufactured by SHIMAZU
Scanning speed: medium speed
Sampling pitch: 1 nm A glass which was made of the same material and has the same thickness was used as the reference for the measurement of transmittance.

The specific resistance of the indium zinc oxide film obtained was measured with Roresta EP manufactured by Mitsubishi Chemical Analytech Co., Ltd. The specific resistance was computed by multiplying the resistance measured by Roresta with the correction coefficient of 0.4532 and further with the film thickness.

Examples 2 to 10 and Comparative Examples 1 to 5

Indium zinc oxide films were formed and evaluated in accordance with the conditions in Table 1 in the same manner as in Example 1. Table 1 shows the results.

In only Comparative Example 2, a sapphire substrate was used in place of the glass substrate in order to prevent the substrate from deformation.

Also, FIGS. 2 to 8 show the results of X-ray diffraction measurement for the indium zinc oxide films obtained in Examples 2 to 5, and Examples 8 to 10, respectively. FIGS. 9 to 12 show the results of X-ray diffraction measurement for the indium zinc oxide films obtained in Comparative Examples 1 to 4, respectively.

In Table 1, the relative intensity means the relative value of height of a peak with respect to the main peak height of 100, after subtraction of the background from each peak. Blank column in the relative intensity indicates that no peak was detected.

The symbol "∞" in the specific resistance indicates incapable measurement of the specific resistance, namely that the specific resistance was $10^8$ μΩcm or more.

TABLE 1

| | Concentration of ZnO [wt %] | Substrate temp. [° C.] | Film thickness [nm] | Atmosphere | Annealing temp. [° C.] | Average transmittance [%] | Specific resistance [μΩcm] | Relative intensity of peak | | | | |
|---|---|---|---|---|---|---|---|---|---|---|---|---|
| | | | | | | | | 2θ = 30.2 to 30.8° | 2θ = 35.5 to 37.0° | 2θ = 39.0 to 40.5° | 2θ = 54.0 to 57.0° | 2θ = 66.5 to 67.8° |
| Ex. 1 | 10.7 | 200 | 300 | Vacuum | 500 | 90.8 | 526 | | 100 | 4 | | 38 |
| Ex. 2 | 10.7 | 200 | 300 | Vacuum | 600 | 91.4 | 416 | | 100 | 6 | | 24 |
| Ex. 3 | 10.7 | 150 | 300 | Vacuum | 600 | 92.3 | 513 | | 58 | 9 | | 100 |

TABLE 1-continued

| | Concentration of ZnO [wt %] | Substrate temp. [° C.] | Film thickness [nm] | Atmosphere | Annealing temp. [° C.] | Average transmittance [%] | Specific resistance [μΩcm] | Relative intensity of peak | | | | |
|---|---|---|---|---|---|---|---|---|---|---|---|---|
| | | | | | | | | 2θ = 30.2 to 30.8° | 2θ = 35.5 to 37.0° | 2θ = 39.0 to 40.5° | 2θ = 54.0 to 57.0° | 2θ = 66.5 to 67.8° |
| Ex. 4 | 10.7 | 250 | 300 | Vacuum | 600 | 89.8 | 363 | 15 | 100 | | | 99 |
| Ex. 5 | 10.7 | 300 | 300 | Vacuum | 600 | 89.2 | 325 | 12 | 36 | | 5 | 100 |
| Ex. 6 | 7.5 | 200 | 300 | Vacuum | 200 | 85.3 | 553 | | 100 | 5 | | 27 |
| Ex. 7 | 5 | 200 | 300 | Vacuum | 200 | 83.7 | 612 | | 100 | 3 | | 25 |
| Ex. 8 | 10.7 | 200 | 50 | Vacuum | 600 | 87.8 | 628 | | 100 | 2 | | |
| Ex. 9 | 10.7 | 200 | 100 | Vacuum | 600 | 98.6 | 544 | | 100 | | | |
| Ex. 10 | 10.7 | 200 | 300 | $N_2$ | 700 | 90.3 | 322 | 15 | 100 | 9 | | 6 |
| Comp. Ex. 1 | 10.7 | 200 | 300 | — | Not treated | 68.8 | 379 | | | | | |
| Comp. Ex. 2 | 10.7 | 200 | 300 | $N_2$ | 800 | 77.2 | 2651 | 1325 | 9 | 100 | | |
| Comp. Ex. 3 | 10.7 | 200 | 300 | Room air | 600 | 78 | ∞ | 167 | 100 | 5 | | |
| Comp. Ex. 4 | 10.7 | Room temp. | 300 | Vacuum | 600 | 77.7 | 635 | 35 | 18 | | 30 | 100 |
| Comp. Ex. 5 | 2 | 200 | 300 | Vacuum | 200 | 73.1 | 19717 | 55 | 100 | 8 | | 13 |

INDUSTRIAL APPLICABILITY

The transparent conductive film of the invention has good electrical conductivity and excellent transparency, which can be suitably used for a transparent electrode of liquid crystal displays, light-emitting diodes (LEDs), organic light-emitting diodes (OLEDs), solar cells, and the like.

Several embodiments and/or examples of the invention were explained above in detail. A person skilled in the art can easily add many modifications to these embodiments and/or examples, without essentially deviating from the novel teachings and advantageous effects of the invention. Accordingly, these many modifications are included in the scope of the invention.

The documents described in the specification are incorporated herein by reference in its entirety.

The invention claimed is:

1. A transparent conductive film which is an indium zinc oxide film comprising $In_2O_3$ crystals, and has an X-ray diffraction peak using a Cuκα ray that appears within at least one area selected from areas ranging from 2θ=35.5° to 37.0°, 39.0° to 40.5° and 66.5° to 67.8°, wherein the peak intensities of peaks that appear within areas ranging from 2θ=30.2° to 30.8° and 54.0° to 57.0° are 20% or less of the peak intensity of the main peak.

2. The transparent conductive film according to claim 1, wherein the content of ZnO is 2 to 20 wt %.

3. The transparent conductive film according to claim 1, wherein the content of Sn is 1000 wt ppm or less.

* * * * *